United States Patent
Ni et al.

(10) Patent No.: US 10,508,225 B2
(45) Date of Patent: Dec. 17, 2019

(54) CONDUCTIVE PARTICLE, ITS MANUFACTURING METHOD AND ANISOTROPIC CONDUCTIVE ADHESIVE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Huan Ni, Beijing (CN); Fengzhen Lv, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 65 days.

(21) Appl. No.: 15/697,631

(22) Filed: Sep. 7, 2017

(65) Prior Publication Data
US 2018/0187052 A1 Jul. 5, 2018

(30) Foreign Application Priority Data
Jan. 5, 2017 (CN) .......................... 2017 1 0006930

(51) Int. Cl.
| | | |
|---|---|---|
| *C09J 9/02* | (2006.01) | |
| *H01L 23/00* | (2006.01) | |
| *C09J 123/06* | (2006.01) | |
| *C09J 129/04* | (2006.01) | |
| *C09J 11/00* | (2006.01) | |

(Continued)

(52) U.S. Cl.
CPC .............. *C09J 9/02* (2013.01); *C09D 129/04* (2013.01); *C09J 11/00* (2013.01); *C09J 123/06* (2013.01); *C09J 129/04* (2013.01); *H01L 24/50* (2013.01); *C08K 9/02* (2013.01); *C08K 2201/001* (2013.01); *H01L 2224/29* (2013.01)

(58) Field of Classification Search
CPC ........................................ C09J 9/02
See application file for complete search history.

(56) References Cited

U.S. PATENT DOCUMENTS 6,495,301 B2 * 12/2002 Everaars .............. G03G 9/0825
430/109.5
2002/0142094 A1 10/2002 Fukushima et al.
(Continued)

FOREIGN PATENT DOCUMENTS

| CN | 103178033 A | 6/2013 |
|---|---|---|
| CN | 105917420 A | 8/2016 |
| CN | 106297959 A | 1/2017 |

(Continued)

OTHER PUBLICATIONS

Machine translation KR 20030038147 (Year: 2003).*
(Continued)

*Primary Examiner* — Alexandre F Ferre
(74) *Attorney, Agent, or Firm* — Brooks Kushman P.C.

(57) ABSTRACT

The present disclosure provides a conductive particle, its manufacturing method and the anisotropic conductive adhesive. The conductive particle comprises a rigid inner core, a resin layer covering an outer surface of the rigid inner core, and a conductive layer covering an outer surface of the resin layer.

17 Claims, 6 Drawing Sheets

(51) Int. Cl.
  *C09D 129/04*  (2006.01)
  *C08K 9/02*  (2006.01)

(56) References Cited

U.S. PATENT DOCUMENTS

2013/0154095 A1* 6/2013 Yu .......................... H01L 24/29
    257/746
2016/0333195 A1 11/2016 Minami et al.

FOREIGN PATENT DOCUMENTS

KR  20030038147 A * 5/2003
TW      554348 B   9/2003

OTHER PUBLICATIONS

First Office Action for Chinese Application No. 201710006930.1, dated Dec. 11, 2017, 7 Pages.
1st Chinese Office Action, English Translation.
TW554348B, English Abstract and U.S. Equivalent U.S. Pub. No. 2002/0142094.
CN103178033A, English Abstract and U.S. Equivalent U.S. Pub. No. 2013/0154095.
CN106297959A, English Abstract and Machine Translation.
CN105917420A, English Abstract and U.S. Equivalent U.S. Pub. No. 2016/0333195.

* cited by examiner

CONDUCTIVE PARTICLE, ITS MANUFACTURING METHOD AND ANISOTROPIC CONDUCTIVE ADHESIVE

CROSS-REFERENCE TO RELATED APPLICATION

This application claims priority to Chinese Patent Application No. 201710006930.1 filed on Jan. 5, 2017, which is incorporated herein by reference in its entirety.

TECHNICAL FIELD

The present disclosure relates to the field of conductive adhesives, and in particular to a conductive particle, a method for manufacturing the same and the anisotropic conductive adhesive.

BACKGROUND

An anisotropic conductive adhesive (ACA) is a conductive adhesive that has electrical conductivity in one direction and almost no electrical conductivity or very high resistivity in the other directions. It has been widely used in the field of manufacturing display panels. Illustratively, the anisotropic conductive adhesive can be used for bonding an array substrate and a color filter substrate or for bonding pins.

In related art, there is an anisotropic conductive adhesive that includes a binder and conductive particles dispersed in the binder, wherein the conductive particle includes a resin sphere and a conductive layer formed on an outer surface of the resin sphere. When a first bonding surface and a second bonding surface are bonded with the anisotropic conductive adhesive, it is possible to first coat the anisotropic conductive adhesive on the first bonding surface and then to press the second bonding surface against the anisotropic conductive adhesive and apply pressure and heat thereto. In this way, the conductive particles dispersed in the anisotropic conductive adhesive will be in contact with each other under the pressure in a direction perpendicular to the first bonding surface, so that the two bonding surfaces have electrical conductivity in the direction perpendicular to the first bonding surface, but have very high resistivity or almost no electrical conductivity in the other directions.

In the process of carrying out the present disclosure, inventors found that the following problems exist in the related art: if the pressure applied to the anisotropic conductive adhesive is too small, the resistivity between the two bonding surfaces will be too large since the conductive particles are not in close contact with each other, and if the pressure is too large, a large number of conductive particles will be crushed, thereby resulting in an open circuit. Therefore, there is a high precision requirement for the pressure applied to the anisotropic conductive adhesive.

SUMMARY

In order to solve the problem of the high precision requirement for the pressure applied to the anisotropic conductive adhesive in the related art, the present disclosure provides a conductive particle for an anisotropic conductive adhesive, a method for manufacturing the same and the anisotropic conductive adhesive.

Specifically, the present disclosure provides the following technical solutions.

According to a first aspect, the present disclosure provides a conductive particle for an anisotropic conductive adhesive, including:

a rigid inner core;
a resin layer covering an outer surface of the rigid inner core; and
a conductive layer covering an outer surface of the resin layer.

Optionally, the resin layer is made of a material with a glass transition temperature higher than 100 degrees Celsius.

Optionally, the resin layer is made of polystyrene for example.

Optionally, a heat-shrinkable resin layer is provided between the resin layer and the conductive layer.

Optionally, the heat-shrinkable resin layer is made of a material with a glass transition temperature lower than 80 degrees Celsius.

Optionally, the heat-shrinkable resin layer is made of a material including at least one of polyethylene and polyvinyl alcohol.

Optionally, the conductive layer includes a first conductive layer and a second conductive layer provided in order from inside to outside.

Optionally, the first conductive layer is a nickel layer and the second conductive layer is a gold layer.

Optionally, an outer surface of the second conductive layer is covered with an anti-oxidative film.

Optionally, the rigid inner core is made of an inorganic composite material.

Optionally, the inorganic composite material includes at least one of calcium carbonate, silicon dioxide and zinc borate.

According to a second aspect, the present disclosure provides a method for manufacturing a conductive particle for an anisotropic conductive adhesive, including:

obtaining a rigid inner core;
forming a resin layer on an outer surface of the rigid inner core to cover the rigid inner core; and
forming a conductive layer on an outer surface of the resin layer to cover the resin layer.

Optionally, the resin layer formed on the outer surface of the rigid inner core to cover the rigid inner core is made of a material with a glass transition temperature higher than 100 degrees Celsius.

Optionally, after forming the resin layer on the outer surface of the rigid inner core to cover the rigid inner core, the method further includes: forming a heat-shrinkable resin layer on an outer surface of the resin layer to cover the resin layer; and the forming the conductive layer on the outer surface of the resin layer to cover the resin layer includes forming the conductive layer on an outer surface of the heat-shrinkable resin layer to cover the heat-shrinkable resin layer.

Optionally, forming the heat-shrinkable resin layer on the outer surface of the resin layer to cover the resin layer includes forming the heat-shrinkable resin layer on the outer surface of the resin layer to cover the resin layer by grafting or coating.

Optionally, the obtaining the rigid inner core includes: producing the rigid inner core made of an inorganic composite material by an in-situ polymerization process, a sol-gel process or a blending process.

According to a third aspect, the present disclosure provides an anisotropic conductive adhesive including: a binder and conductive particles dispersed in the binder, wherein the conductive particle includes a rigid inner core, a resin layer covering an outer surface of the rigid inner core, and a conductive layer covering an outer surface of the resin layer.

Optionally, a heat-shrinkable resin layer is provided between the resin layer and the conductive layer.

BRIEF DESCRIPTION OF THE DRAWINGS

In order to make the technical solutions of the present disclosure more apparent, the drawings desired for the description of the present disclosure will be briefly described hereinafter. Obviously, these drawings are merely some of the embodiments of the present disclosure, and the other drawings can be obtained by a person skilled in the art based on these drawings without any creative work. In the drawings.

Through the above drawings, embodiments of the present disclosure have been shown, which will be described in detail below. These drawings and description thereof are not intended to limit the scope of the concept of the present disclosure in any way, but for illustrating the concept of the present disclosure to a person skilled in the art as particular reference examples.

DETAILED DESCRIPTION

In order to make the objects, technical solutions and advantages of the present disclosure more apparent, the embodiments of the present disclosure will be further described in detail in conjunction with the drawings.

Figure 1:
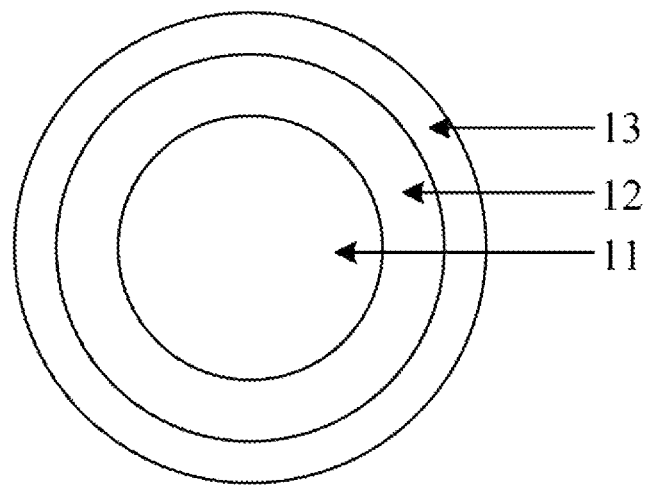
FIG. 1 is a structural schematic view of a conductive particle for an anisotropic conductive adhesive provided in an embodiment of the present disclosure.

FIG. 1 is a structural schematic view of a conductive particle for an anisotropic conductive adhesive provided in an embodiment of the present disclosure. As shown in FIG. 1, the conductive particle for the anisotropic conductive adhesive includes a rigid inner core 11; a resin layer 12 covering an outer surface of the rigid inner core 11; and a conductive layer 13 covering an outer surface of the resin layer 12.

To sum up, in the conductive particle for the anisotropic conductive adhesive provided in the embodiment of the present disclosure, by providing a rigid inner core inside the resin layer, it is able to improve pressure resistance of the conductive particle and increase an upper limit of the pressure that the anisotropic conductive adhesive made of the conductive particles can bear. Therefore, the problem of the high precision requirement for the pressure applied to the anisotropic conductive adhesive in related art is solved, and the effect of reducing the precision requirement for the pressure applied to the anisotropic conductive adhesive is achieved.

Figure 2:
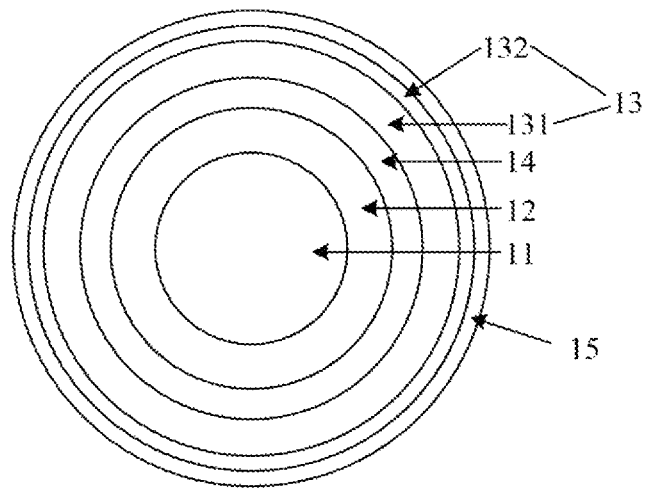
FIG. 2 is a structural schematic view of another conductive particle for an anisotropic conductive adhesive provided in an embodiment of the present disclosure.

Further, referring to FIG. 2 which shows a structural schematic view of another conductive particle for an anisotropic conductive adhesive provided in an embodiment of the present disclosure. This conductive particle contains an optional component based on the conductive particle for the anisotropic conductive adhesive shown in FIG. 1, which makes the conductive particle for the anisotropic conductive adhesive provided in this embodiment of the present disclosure have better performance.

Optionally, the resin layer 12 is made of a material with a glass transition temperature higher than 100 degrees Celsius, such as polystyrene.

Optionally, a heat-shrinkable resin layer 14 is provided between the resin layer 12 and the conductive layer 13. The heat-shrinkable resin layer 14 is made of a material with a glass transition temperature lower than 80 degrees Celsius. For example, the heat-shrinkable resin layer 14 includes at least one of polyethylene (PE) and polyvinyl alcohol (PVA). Upon being heated, the heat-shrinkable resin layer 14 will shrink and apply a pressure to the resin layer 12 inside the heat-shrinkable resin layer. This can reduce the requirement for a lower limit of the pressure applied to the anisotropic conductive adhesive made of the conductive particles (because the heat-shrinkable resin layer has applied a certain pressure to inside the heat-shrinkable resin layer), thereby allowing the pressure applied to the anisotropic conductive adhesive to reach the lower limit more easily and thus reducing the precision requirement for the pressure applied to the anisotropic conductive adhesive.

Figure 3:
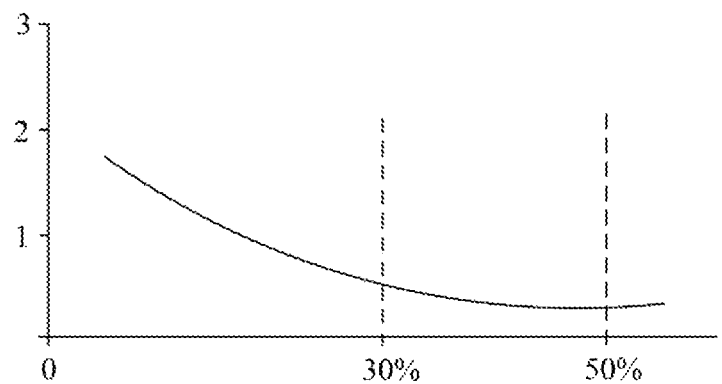
FIG. 3 is a graph showing a relationship between resistivity and a compression ratio of the anisotropic conductive adhesive in the related art.

To some extent, resistivity of the anisotropic conductive adhesive is positively correlated with a compression ratio of the pressurized anisotropic conductive adhesive. FIG. 3 is a graph showing a relationship between the resistivity and a compression ratio of the anisotropic conductive adhesive in the related art, wherein the compression ratio is a ratio of the reduced volume after the compression to a volume before the compression. Illustratively, in a case where the volume before compression is 1 cubic meter and it becomes 0.8 cubic meter after compression, that is, it is reduced by 0.2 cubic meter, the compression ratio is 20%. The horizontal axis represents the compression ratio, and the vertical axis represents the resistivity (its unit is ohm). The compression ratio between 30% and 50% is relatively appropriate because the resistivity is too high in the case where the compression ratio is less than 30%, and the conductive particles in the anisotropic conductive adhesive may be crushed and the elasticity of the conductive particles will disappear in the case where the compression ratio is greater than 50%. When the anisotropic conductive adhesive made of the conductive particles is operated in a high temperature environment, it will expand, resulting in an increase in the distance between two bonding surfaces and thus an open circuit therebetween. In addition, corresponding to the compression ratio, the pressure applied to the anisotropic conductive adhesive when the two bonding surfaces are bonded with the anisotropic conductive adhesive is also in a certain range. Illustratively, the range is greater than or equal to m Newtons but less than or equal to n Newtons (where m is less than n). In the conductive particle provided in the embodiment of the present disclosure, the heat-shrinkable resin layer is provided on the outer surface of the resin layer and will shrink after being heated (the anisotropic conductive adhesive will be heated while a pressure is applied thereto), thus making it possible for the pressure applied to the anisotropic conductive adhesive to reach the m Newtons more easily. The provision of the rigid inner core inside the resin layer may increase the upper limit of the pressure that the conductive particle can bear, and thus increase the upper limit of the pressure that the anisotropic conductive adhesive can bear, i.e., a value of n is increased. This enlarges the range of the pressure that can be applied to the anisotropic conductive adhesive, and accordingly reduces the precision requirement of the pressure applied to the anisotropic conductive adhesive.

In FIG. 2, the conductive layer 13 includes a first conductive layer 131 and a second conductive layer 132 provided in order from inside to outside. These two conductive layers can ensure that the conductive particle for anisotropic conductive adhesive can still be conductive through one of the two conductive layers after the other is damaged.

Optionally, the first conductive layer 131 is a nickel (Ni) layer, and the second conductive layer 132 is a gold (Au) layer.

Optionally, an outer surface of the second conductive layer 132 is covered with an anti-oxidative film 15. The anti-oxidative film 15 is configured to protect the gold layer in the case where the anisotropic conductive adhesive is not in use. Moreover, after a pressure is applied to the anisotropic conductive adhesive, the anti-oxidative film 15 will be broken and will not affect the electrical conduction of the conductive layer 13.

Optionally, the rigid inner core 11 is made of an inorganic composite material which may include at least one of calcium carbonate, silicon dioxide and zinc borate. Furthermore, the rigid inner core 11 may be further made of any other inorganic composite materials which are not limited in this embodiment of the present disclosure. The inorganic composite material has the mechanical strength, modulus and thermal stability of inorganic particles as well as elasticity and easy-to-be processed characteristics of polymers, and is a kind of material having a development prospect in current materials science.

To sum up, in the conductive particle for the anisotropic conductive adhesive provided in the embodiment of the present disclosure, by providing a rigid inner core inside the resin layer, it is able to improve pressure resistance of the conductive particle and increase an upper limit of the pressure that the anisotropic conductive adhesive made of the conductive particles can bear. Therefore, the problem of the high precision requirement for the pressure applied to the anisotropic conductive adhesive in related art is solved, and the effect of reducing the precision requirement for the pressure applied to the anisotropic conductive adhesive is achieved.

Figure 4:
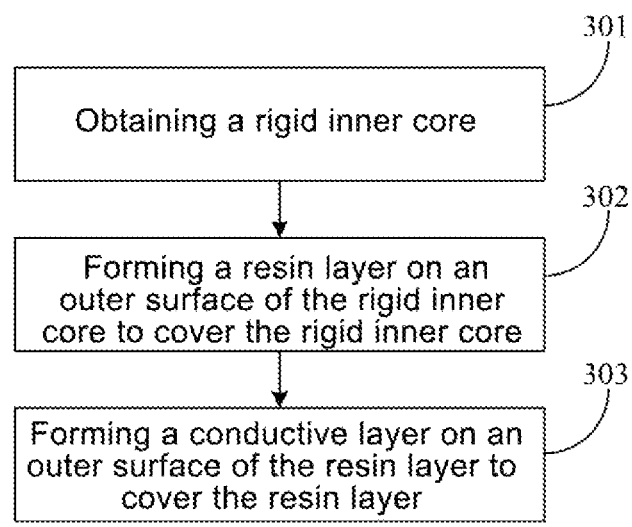
FIG. 4 is a flow chart showing a method for manufacturing the conductive particle for the anisotropic conductive adhesive provided in an embodiment of the present disclosure.

FIG. 4 is a flow chart showing a method for manufacturing the conductive particle for the anisotropic conductive adhesive provided in an embodiment of the present disclosure, the method can be used to the manufacturing of the conductive particle for the anisotropic conductive adhesive shown in FIG. 1 and includes:

Step 301: obtaining a rigid inner core;
Step 302: forming a resin layer on an outer surface of the rigid inner core to cover the rigid inner core; and
Step 303: forming a conductive layer on an outer surface of the resin layer to cover the resin layer.

Figure 5:
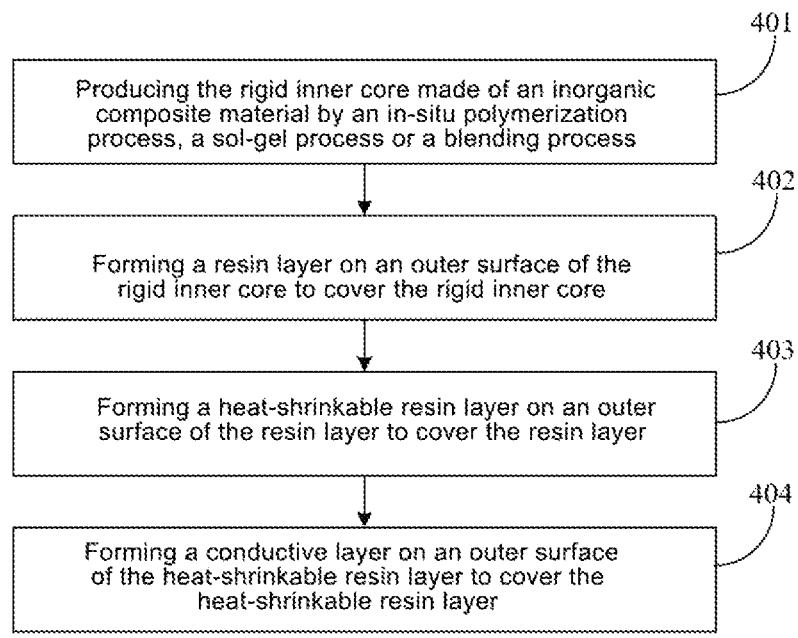
FIG. 5 is a flow chart showing another method for manufacturing the conductive particle for the anisotropic conductive adhesive provided in an embodiment of the present disclosure.

To sum up, in the method for manufacturing the conductive particle for the anisotropic conductive adhesive provided in the embodiment of the present disclosure, by providing a rigid inner core inside the resin layer, it is able to improve pressure resistance of the conductive particle and increase an upper limit of the pressure that the anisotropic conductive adhesive made of the conductive particles can bear. Therefore, the problem of the high precision requirement for the pressure applied to the anisotropic conductive adhesive in related art is solved, and the effect of reducing the precision requirement for the pressure applied to the anisotropic conductive adhesive is achieved. FIG. 5 is a flow chart showing another method for manufacturing the conductive particle for the anisotropic conductive adhesive provided in an embodiment of the present disclosure, the method can be used to the manufacturing of the conductive particle for the anisotropic conductive adhesive shown in FIG. 2 and includes:

Step 401: producing the rigid inner core made of an inorganic composite material by an in-situ polymerization process, a sol-gel process or a blending process.

In the method for manufacturing the conductive particle for the anisotropic conductive adhesive provided in the embodiment of the present disclosure, the rigid inner core made of the inorganic composite material may be first produced by the in-site polymerization process, the sol-gel process or the blending process. You may refer to the related art for the implementation of these methods, which will not be described here.

The provision of the rigid inner core inside the resin layer may increase the upper limit of the pressure that the conductive particle for the anisotropic conductive adhesive can bear, and thus increase the upper limit of the pressure that the anisotropic conductive adhesive can bear. This will enlarge the range of the pressure that can be applied to the anisotropic conductive adhesive, and accordingly reduce the precision requirement of the pressure applied to the anisotropic conductive adhesive.

At Step 402, a resin layer is formed on an outer surface of the rigid inner core to cover the rigid inner core.

After obtaining the rigid inner core made of the inorganic composite material, a resin layer may be formed on an outer surface of the rigid inner core to cover the rigid inner core. The resin layer is made of a material with a glass transition temperature higher than 100 degrees Celsius, such as polystyrene. The resin layer may be formed by referring to the related art, which will not be described here.

At Step 403, a heat-shrinkable resin layer is formed on an outer surface of the resin layer to cover the resin layer.

After forming the resin layer on the outer surface of the rigid inner core to cover the rigid inner core, a heat-shrinkable resin layer may be formed on the outer surface of the resin layer to cover the resin layer.

Figure 6:
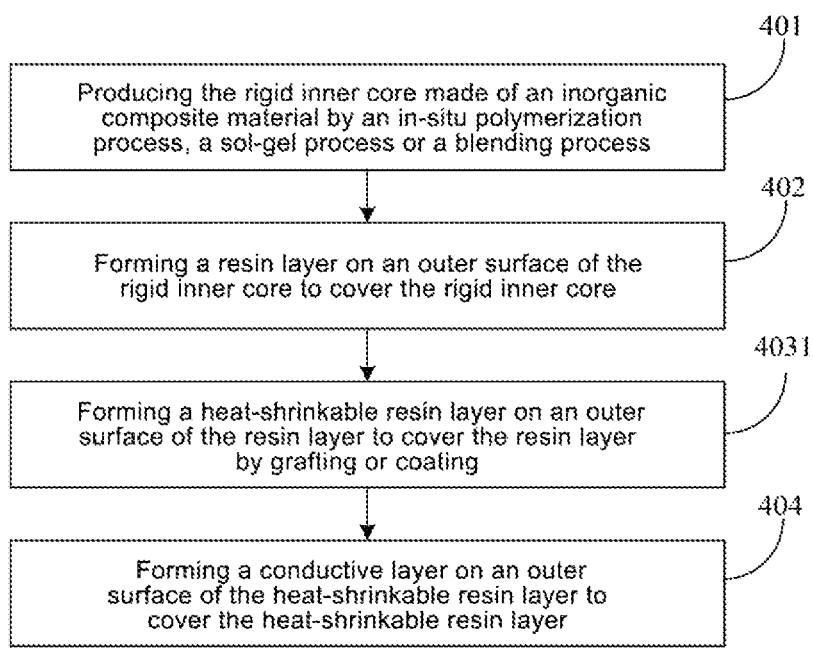
FIG. 6 is a flow chart showing the method for manufacturing the conductive particle in the embodiment shown in FIG. 5, specifically indicating the way in which the heat-shrinkable resin layer is formed.

As shown in FIG. 6, the method for manufacturing the conductive particle may further includes:

Sub-step 4031: forming the heat-shrinkable resin layer on the outer surface of the resin layer to cover the resin layer by grafting or coating.

The heat-shrinkable resin layer may be formed on the outer surface of the resin layer to cover the resin layer by grafting or coating. Grafting refers to a reaction in which a macromolecule chain is combined with an appropriate branched chain or functional side group by a chemical bond, and the resulting product is called graft copolymer. This method can be used to make the heat-shrinkable resin layer cover the outer surface of the resin layer. Alternatively, the heat-shrinkable resin layer may be directly coated on the outer surface of the resin layer by coating.

The heat-shrinkable resin layer is made of a material including at least one of polyethylene and polyvinyl alcohol. Upon being heated, the heat-shrinkable resin layer will shrink and apply a pressure to the resin layer inside the heat-shrinkable resin layer. This can reduce the requirement for a lower limit of the pressure applied to the anisotropic conductive adhesive made of the conductive particles, thus reducing the precision requirement for the pressure applied to the anisotropic conductive adhesive.

At Step 404, a conductive layer is formed on an outer surface of the heat-shrinkable resin layer to cover the heat-shrinkable resin layer.

After the outer surface of the resin layer is covered with the heat-shrinkable resin layer, a conductive layer may be formed on an outer surface of the heat-shrinkable resin layer to cover the heat-shrinkable resin layer.

Figure 7:
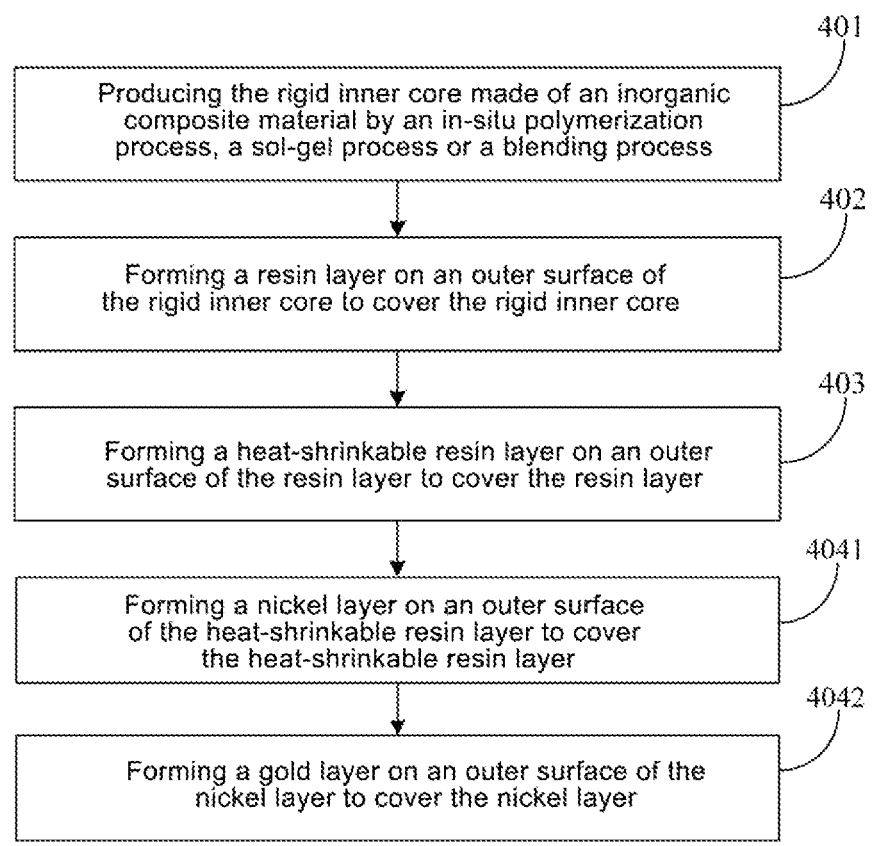
FIG. 7 is a flow chart showing the method for manufacturing the conductive particle in the embodiment shown in FIG. 5, specifically indicating the way in which the conductive layer is formed.

As shown in FIG. 7, the method for manufacturing the conductive particle may further includes:

Sub-step 4041: forming a nickel layer on the outer surface of the heat-shrinkable resin layer to cover the heat-shrinkable resin layer.

Sub-step 4042: forming a gold layer on an outer surface of the nickel layer to cover the nickel layer.

When forming the conductive layer on the outer surface of the heat-shrinkable resin layer, a nickel layer may be first formed on the outer surface of the heat-shrinkable resin layer to cover the heat-shrinkable resin layer.

After forming the nickel layer on the outer surface of the heat-shrinkable resin layer to cover the heat-shrinkable resin layer, a gold layer may be formed on the outer surface of the nickel layer to cover the nickel layer.

To sum up, in the method for manufacturing the conductive particle for the anisotropic conductive adhesive provided in the embodiment of the present disclosure, by providing a rigid inner core inside the resin layer, it is able to improve pressure resistance of the conductive particle and increase an upper limit of the pressure that the anisotropic conductive adhesive made of the conductive particles can bear. Therefore, the problem of the high precision requirement for the pressure applied to the anisotropic conductive adhesive in related art is solved, and the effect of reducing the precision requirement for the pressure applied to the anisotropic conductive adhesive is achieved.

Figure 8:
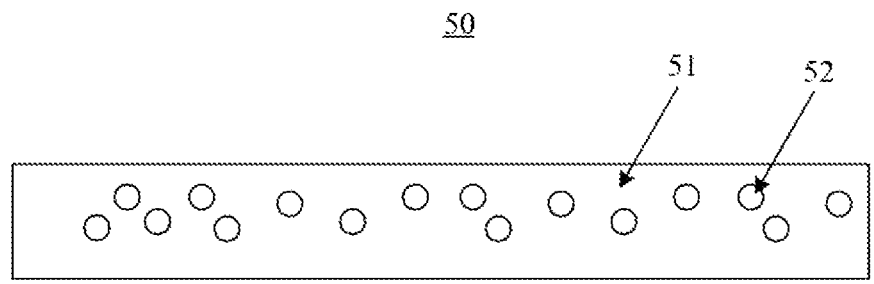
FIG. 8 is a structural schematic view of an anisotropic conductive adhesive provided in an embodiment of the present disclosure.

FIG. 8 is a structural schematic view of an anisotropic conductive adhesive provided in an embodiment of the present disclosure. The anisotropic conductive adhesive 50 includes a binder 51 and conductive particles 52 dispersed in the binder 51. The conductive particle 52 includes a rigid inner core, a resin layer covering an outer surface of the rigid inner core, and a conductive layer covering an outer surface of the resin layer. A heat-shrinkable resin layer may be provided between the resin layer and the conductive layer.

The conductive particle 52 in the anisotropic conductive adhesive provided in the embodiment of the present disclosure may be the conductive particle for the anisotropic conductive adhesive shown in FIG. 1 or the conductive particle for the anisotropic conductive adhesive shown in FIG. 2.

The anisotropic conductive adhesive provided in the embodiment of the present disclosure can be applied to an outer leader bonding (OLB) process or forming a cell in a one drop filling (ODF) process.

In the OLB process, the anisotropic conductive adhesive provided in the embodiment of the present disclosure may be applied to the connection of pins of a table automatic bonding (TAB) integrated circuit (IC) with display screen terminals.

Figure 9:
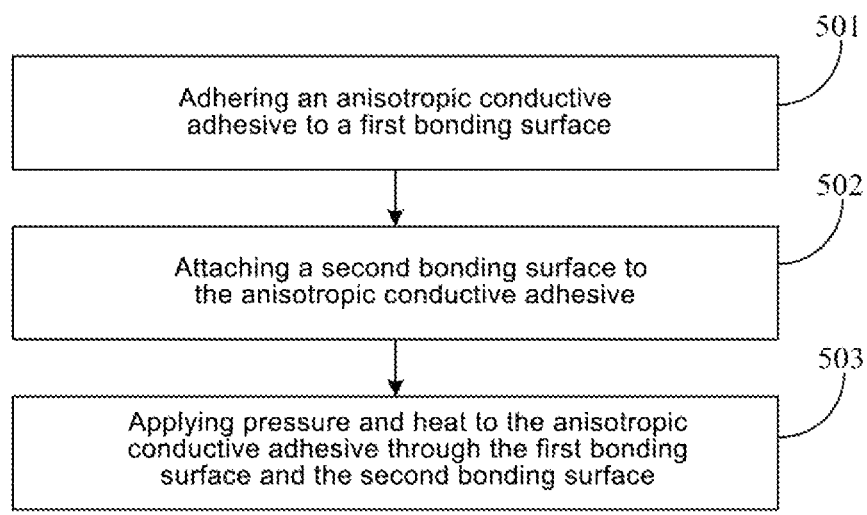
FIG. 9 is a flow chart showing a method of using the anisotropic conductive adhesive in the embodiment shown in FIG. 8.

As shown in FIG. 9, the connection process may include the following three steps.

At Step 501, the anisotropic conductive adhesive is adhered to a first bonding surface.

First, the anisotropic conductive adhesive may be adhered to the first bonding surface which may be a bonding surface on the TAB-IC or on the display screen terminal. The first bonding surface may be provided with conductive pins 631.

Figure 10A:
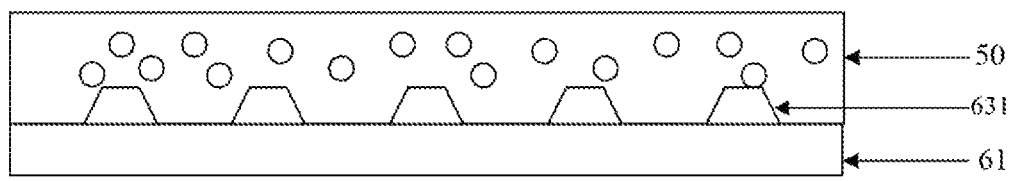
FIG. 10A is a structural schematic view obtained in the flow chart shown in FIG. 9.

At the end of this step, the structure formed by the anisotropic conductive adhesive and the first bonding surface may be as shown in FIG. 10A, in which the anisotropic conductive adhesive 50 is adhered to the first bonding surface 61.

At Step 502, a second bonding surface is attached to the anisotropic conductive adhesive.

After the anisotropic conductive adhesive is adhered to the first bonding surface, the second bonding surface may be attached to the anisotropic conductive adhesive. The second bonding surface may be also provided with conductive pins 632. When attaching the second bonding surface, the conductive pins 632 on the second bonding surface may be aligned with the conductive pins 631 on the first bonding surface.

Figure 10B:
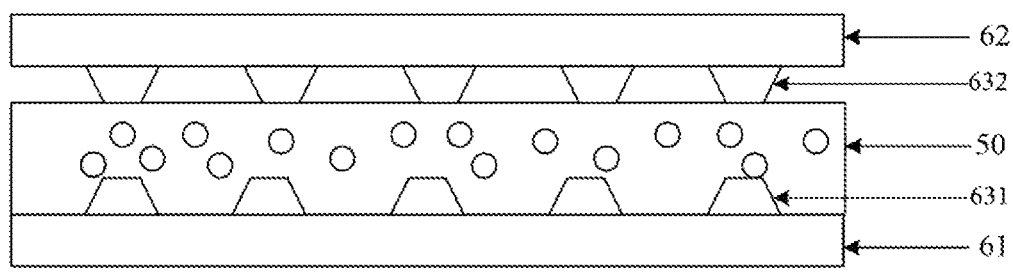
FIG. 10B is another structural schematic view obtained in the flow chart shown in FIG. 9.

At the end of this step, the structure formed by the second bonding surface, the first bonding surface and the anisotropic conductive adhesive may be as shown in FIG. 10B, in which the second bonding surface 62 is attached to the anisotropic conductive adhesive 50.

At Step 503, pressure and heat are applied to the anisotropic conductive adhesive through the first bonding surface and the second bonding surface.

After the second bonding surface has been attached, pressure and heat may be applied to the anisotropic conductive adhesive through the first bonding surface and the second bonding surface, so that the conductive particles in the anisotropic conductive adhesive will be squashed to allow the conductive pins on the two bonding surfaces to be connected.

Figure 10C:
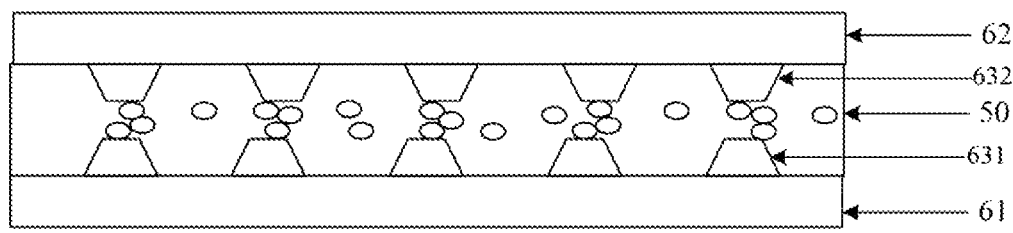
FIG. 10C is another structural schematic view obtained in the flow chart shown in FIG. 9.

At the end of this step, the structure formed by the second bonding surface, the first bonding surface and the anisotropic conductive adhesive may be as shown in FIG. 10C, in which the conductive pins 631 on the first bonding surface 61 and the conductive pins 632 on the second bonding surface 62 are electrically connected by the anisotropic conductive adhesive 50 in a direction perpendicular to the first bonding surface 61, but are electrically insulated in the other directions.

For a method of applying the anisotropic conductive adhesive 50 provided in the embodiment of the present disclosure to the ODF process, steps 501 to 503 may be referred to. What is different from the steps 501 to 503 is that the anisotropic conductive adhesive may be cured with UV light prior to applying pressure and heat to it.

When applied to the ODF process, the anisotropic conductive adhesive provided in the embodiment of the present disclosure is capable of reducing high fluctuation of the bonding area due to uneven pressure by controlling the range of fluctuation of the compression ratio of the conductive particle (by the rigid inner core and the heat-shrinkable resin layer), and thus capable of improving the uniformity of the thickness of the display panel and reducing mura around edges of the display panel.

To sum up, in the method for manufacturing the conductive particle for the anisotropic conductive adhesive provided in the embodiment of the present disclosure, by providing a rigid inner core inside the resin layer, it is able to improve pressure resistance of the conductive particle and increase an upper limit of the pressure that the anisotropic conductive adhesive made of the conductive particles can bear. Therefore, the problem of the high precision requirement for the pressure applied to the anisotropic conductive adhesive in related art is solved, and the effect of reducing the precision requirement for the pressure applied to the anisotropic conductive adhesive is achieved.

In the present disclosure, the term "at least one of A and B" is merely an association for describing associated objects, representing that three relationships may exist. For example, at least one of A and B may represent three cases as follows: A exists alone, A and B exist at the same time, and B exists alone. Similarly, "at least one of A, B and C" represents that seven relationships may exist as follows: A exists alone, B exists alone, C exists alone, A and B exist at the same time, A and C exist at the same time, C and B exist at the same time, and A, B and C exist at the same time. Similarly, "at least one of A, B, C and D" represents that fifteen relationships may exist as follows: A exists alone, B exists alone, C exists alone, D exists alone, A and B exist at the same time, A and C exist at the same time, A and D exist at the same time, B and C exist at the same time, B and D exist at the same time, C and D exist at the same time, A, B and C exist at the same time, A, B and D exist at the same time, B, C and D exist at the same time, A, C and D exist at the same time, and A, B, C and D exist at the same time.

A person skilled in the art may understand that all or part of the steps of the embodiment can be implemented by hardware or by related hardware instructed by programs which may be stored in a computer readable storage medium. The storage medium may be read-only memory, a magnetic disk or an optical disk.

The above are merely preferable embodiments of the present disclosure, and are not intended to limit the present disclosure. Any modifications, equivalents, and improvements made within the spirit and principle of the present disclosure should all be encompassed within the protection scope of the present disclosure.

What is claimed is:

1. A conductive particle, comprising:
a rigid inner core;
a resin layer covering an outer surface of the rigid inner core;
a conductive layer covering an outer surface of the resin layer; and
a heat-shrinkable resin layer provided between the resin layer and the conductive layer.

2. The conductive particle according to claim 1, wherein the resin layer is made of a material with a glass transition temperature higher than 100 degrees Celsius.

3. The conductive particle according to 1, wherein the heat-shrinkable resin layer is made of a material with a glass transition temperature lower than 80 degrees Celsius.

4. The conductive particle according to claim 1, wherein the heat-shrinkable resin layer is made of a material comprising at least one of polyethylene and polyvinyl alcohol.

5. The conductive particle according to claim 1, wherein the conductive layer comprises a first conductive layer and a second conductive layer provided in order from inside to outside.

6. The conductive particle according to claim 5, wherein the first conductive layer is a nickel layer and the second conductive layer is a gold layer.

7. The conductive particle according to claim 5, wherein an outer surface of the second conductive layer is covered with an anti-oxidative film.

8. The conductive particle according to claim 1, wherein the rigid inner core is made of an inorganic composite material.

9. The conductive particle according to claim 8, wherein the inorganic composite material comprises at least one of calcium carbonate, silicon dioxide and zinc borate.

10. An anisotropic conductive adhesive comprising: a binder and conductive particles dispersed in the binder, wherein the conductive particle comprises a rigid inner core, a resin layer covering an outer surface of the rigid inner core, a conductive layer covering an outer surface of the resin layer, and a heat-shrinkable resin layer provided between the resin layer and the conductive layer.

11. The anisotropic conductive adhesive according to claim 10, wherein the resin layer is made of a material with a glass transition temperature higher than 100 degrees Celsius.

12. The anisotropic conductive adhesive according to claim 10, wherein the heat-shrinkable resin layer is made of a material comprising at least one of polyethylene and polyvinyl alcohol.

13. The anisotropic conductive adhesive according to claim 10, wherein the conductive layer comprises a first conductive layer and a second conductive layer provided in order from inside to outside.

14. The anisotropic conductive adhesive according to claim 13, wherein the first conductive layer is a nickel layer and the second conductive layer is a gold layer.

15. A method for manufacturing a conductive particle, comprising:
obtaining a rigid inner core;
forming a resin layer on an outer surface of the rigid inner core to cover the rigid inner core;
forming a heat-shrinkable resin layer on an outer surface of the resin layer to cover the resin layer; and
forming a conductive layer on an outer surface of the heat-shrinkable resin layer to cover the heat-shrinkable resin layer.

16. The method according to claim 15, wherein the forming the heat-shrinkable resin layer on the outer surface of the resin layer to cover the resin layer comprises:
forming the heat-shrinkable resin layer on the outer surface of the resin layer to cover the resin layer by grafting or coating.

17. The method according to claim 15, wherein the obtaining the rigid inner core comprises:
producing the rigid inner core made of an inorganic composite material by an in-situ polymerization process, a sol-gel process or a blending process.

* * * * *